United States Patent [19]

Austin et al.

[11] Patent Number: 5,644,265
[45] Date of Patent: Jul. 1, 1997

[54] OFF-CHIP DRIVER FOR MIXED VOLTAGE APPLICATIONS

[75] Inventors: John Stephen Austin, Burlington; Douglas Willard Stout, Milton, both of Vt.

[73] Assignee: International Business Machines Corporation, Armonk, N.Y.

[21] Appl. No.: 431,882

[22] Filed: May 1, 1995

[51] Int. Cl.$^6$ .................................................. H03L 5/00
[52] U.S. Cl. ................................................ 327/333; 327/80
[58] Field of Search ........................... 326/62, 63, 68, 326/80, 81, 113; 327/319, 333

[56] References Cited

U.S. PATENT DOCUMENTS

| | | | |
|---|---|---|---|
| 4,216,390 | 8/1980 | Stewart | 307/264 |
| 4,416,143 | 11/1983 | Miyamoto | 307/264 |
| 4,419,593 | 12/1983 | Butler et al. | 307/268 |
| 4,506,164 | 3/1985 | Higuchi | 307/264 |
| 4,574,273 | 3/1986 | Atsumi et al. | 307/475 |
| 4,704,549 | 11/1987 | Sanwo et al. | 307/475 |
| 4,709,162 | 11/1987 | Braceras et al. | 307/200 B |
| 4,767,950 | 8/1988 | Schrenk | 307/450 |
| 4,782,250 | 11/1988 | Adams et al. | 307/473 |
| 4,820,941 | 4/1989 | Dolby et al. | 307/449 |
| 4,837,462 | 6/1989 | Watanabe et al. | 307/446 |
| 4,926,070 | 5/1990 | Tanaka et al. | 307/475 |
| 4,958,091 | 9/1990 | Roberts | 307/451 |
| 5,128,560 | 7/1992 | Chern et al. | 307/475 |
| 5,144,165 | 9/1992 | Dhong et al. | 307/451 |
| 5,151,616 | 9/1992 | Komuro | 307/451 |
| 5,151,619 | 9/1992 | Austin et al. | 307/473 |
| 5,223,751 | 6/1993 | Simmons et al. | 307/475 |
| 5,266,849 | 11/1993 | Kitahara et al. | 307/475 |
| 5,276,364 | 1/1994 | Wellheuser | 307/475 |
| 5,276,366 | 1/1994 | Quigley et al. | 307/475 |
| 5,300,835 | 4/1994 | Assar et al. | 307/475 |
| 5,304,872 | 4/1994 | Avraham et al. | 307/475 |
| 5,321,324 | 6/1994 | Hardee et al. | 307/475 |
| 5,332,932 | 7/1994 | Runaldue | 307/443 |
| 5,352,942 | 10/1994 | Tanaka et al. | 307/475 |
| 5,512,844 | 4/1996 | Nakakura et al. | 326/81 |
| 5,530,672 | 6/1996 | Konishi | 326/81 |
| B1 4,963,766 | 8/1992 | Lundberg | 307/451 |

OTHER PUBLICATIONS

Sedra & Smith, 'Microelectronic Circuits', Saunders College Publishing, Philadelphia 1991 Fig. 13.25.
Authors: Makoto Ueda*;Allen Carl;Joe Iadanza;Hiroshi Oshikawa*;Masaaki Yamamoto*;Mark Nelson;Fred Jacquish;Michinori Nishihara*; * IBM Yasu Technology Application Laboratory, Ichimiyake-800, Yasu, Shiga-ken, Japan; ** IBM Technology Products, Essex Junction, VT, USA; Title: A 3.3V ASIC for Mixed Voltage Applications With Shut Down Mode; IEEE 1993 Custom Integrated Circuits Conference.

*Primary Examiner*—Timothy P. Callahan
*Assistant Examiner*—Jeffrey Zweizig
*Attorney, Agent, or Firm*—Eugene I. Shkurko

[57] ABSTRACT

A level shifting driver shifts a low magnitude logic signal to a high magnitude logic signal while preventing a high supply voltage as associated with the high magnitude logic signal from feeding back into logic devices associated with providing the low magnitude logic signal. An input terminal receives the low magnitude logic signal from a given low voltage logic device. An N-channel MOSFET has its channel disposed serially between the input terminal and an output terminal and its gate coupled to a low supply voltage of the low voltage logic device. A latch network biased by the high supply voltage has one node of its latch coupled to the output terminal for providing an output signal representative of the low magnitude logic signal but of a high magnitude established in accordance with the high supply voltage.

9 Claims, 10 Drawing Sheets

OFF-CHIP DRIVER FOR MIXED VOLTAGE APPLICATIONS

TECHNICAL FIELD

The present invention relates to an off-chip driver circuit and more particularly relates to an off-chip driver circuit for interfacing low voltage logic devices to high voltage logic devices.

BACKGROUND ART

There has been a trend in the semi-conductor field for reducing the geometries of C-MOS logic devices. As the chip geometries have decreased, so too have the voltages required for operating the logic devices. However, the lower voltage logic devices still need to interface with existing high voltage logic devices. Accordingly, what is required, is a device capable of shifting low voltage logic signals of low voltage logic devices (i.e. 3.3 volts) to high voltage logic signals compatible with high voltage logic devices (i.e. 5 volts).

DISCLOSURE OF THE INVENTION

It is an object of the present invention to provide a level shifter capable of interfacing between a low voltage logic device and a high voltage logic device wherein current from an associated high voltage supply of the high voltage logic device is prevented from feeding back into the low voltage logic device.

It is a further object of the present invention to provide such a level shifting interface with improved responsiveness.

In furtherance of these objectives, the present invention, in accordance with a first embodiment, is directed to a level shifter having a first terminal for receiving an input signal of a first voltage magnitude and a second terminal for sending out an output signal representative of the input signal but of a second voltage magnitude. A pass gate is disposed between the first and second terminals. A latch network biased by a secondary supply voltage corresponding to the second voltage magnitude has one node thereof coupled to the second terminal.

Preferably, the pass gate is an N-channel MOSFET with its channel coupled serially between the first and second terminals and its gate coupled to the first supply node for receiving a primary supply voltage corresponding to the first voltage magnitude.

In accordance with one aspect of the first embodiment of the present invention, the latch network comprises first and second inverters coupled in a series loop with one another. The first and second inverters are biased by the secondary supply voltage. One node intermediate the first and second inverters is coupled to the second terminal.

In accordance with an alternative embodiment of the present invention, a level shifter includes a first terminal for receiving an input signal of a first voltage magnitude, and a second terminal for sending out an output signal representative of the input signal but of a second voltage magnitude. A first supply node provides a first supply voltage corresponding to the first voltage magnitude while a second supply node provides a second supply voltage corresponding to the second voltage magnitude. A pass gate is disposed between the first and second terminals. A first P-MOSFET has its source coupled to the second supply node for receiving the second supply voltage, its gate coupled to the second terminal, and its drain coupled to an intermediate node. A first N-MOSFET has its source coupled to ground, its gate coupled to the first terminal for receiving the input signal directly, and its drain coupled to the intermediate node. A second P-MOSFET has its source coupled to the second supply node for receiving the second supply voltage, its gate coupled to the intermediate node, and has its drain coupled to the second terminal.

In yet another embodiment of the present invention, a level shifting driver includes a first terminal for providing a first supply voltage and a second terminal for providing a second supply voltage that is greater than the first supply voltage. A pull-up device is disposed between an output terminal and the second terminal. The pull-up device has a gate coupled to a first node. A level shifter circuit is disposed between the second terminal and the first node, i.e. the gate of the pull-up device. A pull-up predrive circuit is coupled to the first terminal to receive the first supply voltage and provides a pre-drive signal at a second node at a magnitude limited according to the first supply voltage. A pass gate is disposed between the second node and the first node for preventing current from the second voltage supply from feeding back into the pull-up predrive circuit. Preferably the pass gate comprises an N-MOSFET coupled with its channel serially between the first and second nodes and having its gate coupled to the first terminal for receiving the first supply voltage.

Another embodiment of the present invention includes a level shifting driver having first and second terminals for providing first and second supply voltages respectively, wherein the second supply voltage is greater than the first voltage supply. A pull-up device is disposed between an output terminal and the second terminal and has a pull-up device gate coupled to a first node. A NAND gate, biased by the second supply voltage has first and second inputs for receiving a data signal and an enable signal respectively which are logically combined per a NAND logic function to provide a logic output signal at an output thereof coupled to the first node. A first level shifter circuit is disposed between the first input of the NAND gate and a second node. A data predriver is placed between the second node and a data input terminal for receiving a low magnitude data input signal. A second level shifter circuit is disposed between the second input of the NAND gate and a third node. An enable predriver is disposed between the third node and at least one low magnitude enable input signal. Preferably, the present embodiment further comprises a di/dt controller coupled to the first node for limiting a discharge rate at the first node.

BRIEF DESCRIPTION OF DRAWINGS

The foregoing and other objects, features and advantages of the invention will be apparent from the following more particular description of preferred embodiments of the invention as illustrated in the accompanying drawings in which:

FIG. 8b is the remaining schematic diagram for the level shifting circuit of FIG. 8a;

BEST MODE FOR CARRYING OUT THE INVENTION

Figure 1:
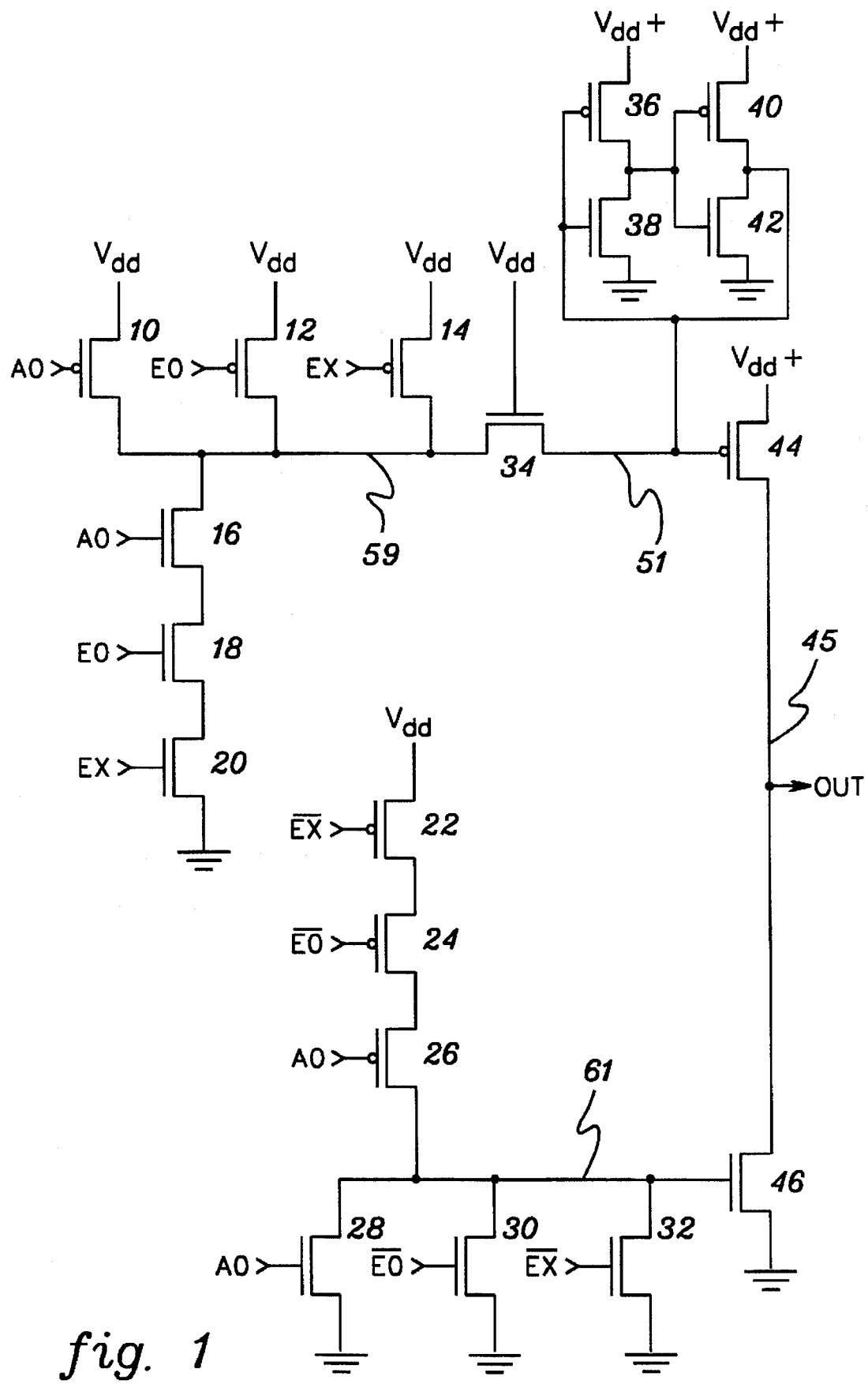
FIG. 1 is a schematic diagram of a level shifting circuit in accordance with the present invention.
Figure 2:
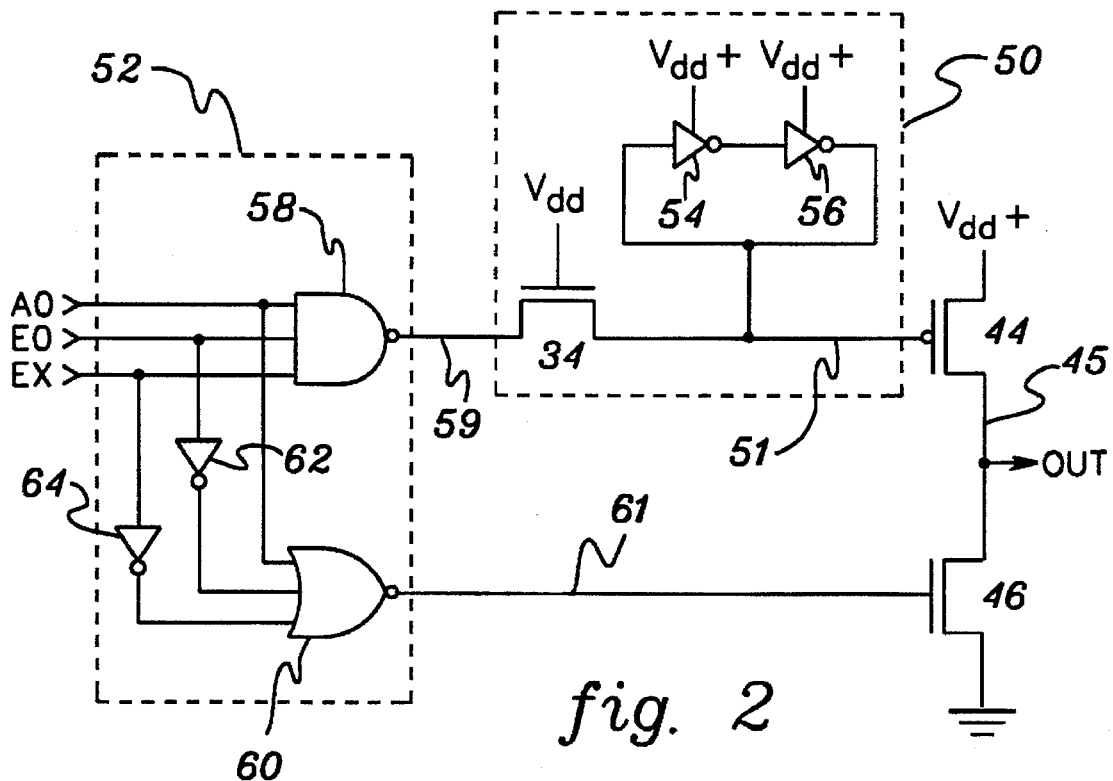
FIG. 2 is a simplified schematic diagram of the level shifting circuit of FIG. 1.

With reference to FIGS. 1 and 2, a level shifting circuit receives an input signal A0 from a low voltage environment which is level shifted to provide an output signal at node 45 for a higher voltage environment. Pre-driver 52 receives data input signal A0 and two enable signals E0 and Ex. Data input signal A0 and enable input signals E0 and EX are coupled to respective inputs of three input NAND gate 58 comprising FETs 10–20 and also to respective inputs of three input NOR gate 60 as associated with FETs 22–32. The enable signals E0 and EX each are coupled to NOR gate 60 via associated inverters 62 and 64 as illustrated in FIG. 2 (but not illustrated in FIG. 1). The output of NAND gate 58 provides an inverted representation of data input signal A0 assuming that both enable signals are high. Likewise, NOR gate 60 sends out an inverted representation of data input signal A0 at node 61. Examining the upper signal path of predriver 52, the pull-up predriver output signal at node 59 is coupled to a level shifting circuit 50 comprising FET 34 and latch inverters 54 and 56. N-FET 34 has its channel coupled electrically in series with the predriver pull-up signal path. The gate of N-FET 34 is tied to the low supply voltage associated with the low level logic devices, i.e. $V_{dd}$. It is noted that the logic devices of predriver 52 are biased by the low supply voltage $V_{dd}$.

Latch inverters 54 and 56 are coupled together in a serial loop. The output of first inverter 54 is coupled to the input of second inverter 56, and the output of the second inverter is coupled back to the input of the first inverter. A node intermediate the two inverters is coupled to the drain of N-FET 34, which provides output 51 of level shift circuit 50. The output 51 of level shift circuit 50 is coupled to the gate of pull-up P-FET 44 of the complimentary output stage. The source of P-FET 44 is tied to the high supply voltage as associated with the high level logic devices, i.e. $V_{dd+}$. The high supply voltage $V_{dd+}$ biases also the two inverters 54,56 within level shifter 50. The drain of P-FET 44 is tied to output terminal 45.

The pull-down predrive output signal from the lower signal path of predriver 52, at node 61, is coupled to the gate of pull-down N-FET 46 of the complimentary output stage. The source of N-FET 46 is tied to ground while its drain is coupled to output terminal 45.

Inverters 54 and 56 comprise associated FET transistors 36–42 as illustrated in FIG. 1. It is noted again that the inverters are biased to the upper supply voltage $V_{dd+}$ as associated with high voltage logic devices.

In operation, assuming that data input signal A0 transitions from logic 0 to logic 1 with the enable signals logic high, predrive circuit 52 provides a low output at pull-up output 59 and pull-down output 61. With the gate of N-FET 34 tied to $V_{dd}$ and the low output of NAND gate 58, N-FET 34 is biased ON for passing current as supplied by FET inverter 56. The output of FET inverter 56 sources a current less than the current sink capabilities of NAND gate 58. In other words, the channel ON-resistance of P-FET 40, with reference to FIG. 1, is greater than the combined series channel ON-resistances of FETs 16–20 associated with the low level output resistance of NAND gate 58. Eventually, because NAND gate 58 sinks more current to ground than that sourced by inverter 56, the voltage at node 51 crosses the input logic threshold level of inverter 54. Inverter 54 accordingly interprets a low level logic input and provides a high logic output. Once the output of inverter 54 transitions high, inverter 56 transitions low. With a low logic voltage present on node 51, P-FET 44 is enabled ON for coupling output node 45 to the high supply voltage $V_{dd+}$, via the channel ON-resistance of P-FET 44. Note that the pull-down output 61 from predriver 52 is also low which disables N-FET 46. In sum, when data input A0 transitions high, output 45 also transitions high once the voltage at node 51 transitions below the logic threshold level of inverter 54, at which time node 51 transitions low (via NAND gate 58 and inverter 56) for turning P-FET 44 fully ON.

In an alternative operation, data input signal A0 transitions from a high state to a low state while the enable signals E0 and Ex are both high. Accordingly, the pull-up output 59 and the pull-down output 61 of predriver 52 transition high. NAND gate 58 sources current to node 51 via pass gate 34 while N-FET 42, associated with inverter 56, is sinking current to ground. By design, the current sourcing capability of NAND gate 58, i.e. FETs 10–14, is greater than the current sinking capability of N-FET 42 of inverter 56; therefore, the voltage level at node 51 gradually increases. Eventually, the voltage level at node 51 transitions above the input logic threshold level of inverter 54 such that inverter 54 transitions low, at which time inverter 56 transitions high. With a high voltage level at node 51, P-FET 44, associated with the complimentary output stage of the level shifting circuit, is disabled.

The voltage present at node 51 is equal to the upper supply voltage $V_{dd+}$ as provided by P-FET 40 of inverter 56. The pull-up output 59 of predrive 52 is coupled to the low voltage supply $V_{dd}$ via the ON channels of P-FETs 10,12, and 14. The gate of N-FET 34 is coupled to the low supply voltage $V_{dd}$. With the output of NAND gate 58 high, i.e. $V_{dd}$, there is no gate-to-source voltage drop for FET 34; N-FET 34 is disabled. Therefore, the high supply voltage at the drain of N-FET 34, i.e. $V_{dd+}$, is isolated from predriver 52. In sum, level shifter 50 receives a logic signal of a first voltage magnitude from an input terminal and shifts the voltage level of the input signal to provide an output signal related to the input signal but of a second voltage magnitude greater than the first voltage magnitude while preventing voltages as associated with the higher magnitude from feeding back to the input terminal.

As noted previously, the pull-down output 61 of predriver 52 provides a high level logic output signal. Since predriver 52 is biased by the low supply voltage $V_{dd}$, the high level of logic output signal corresponds to a voltage level of $V_{dd}$. This voltage level is sufficient to turn N-FET 46 fully on such that output 45 is coupled to ground via the channel of N-FET 46.

Figure 4:
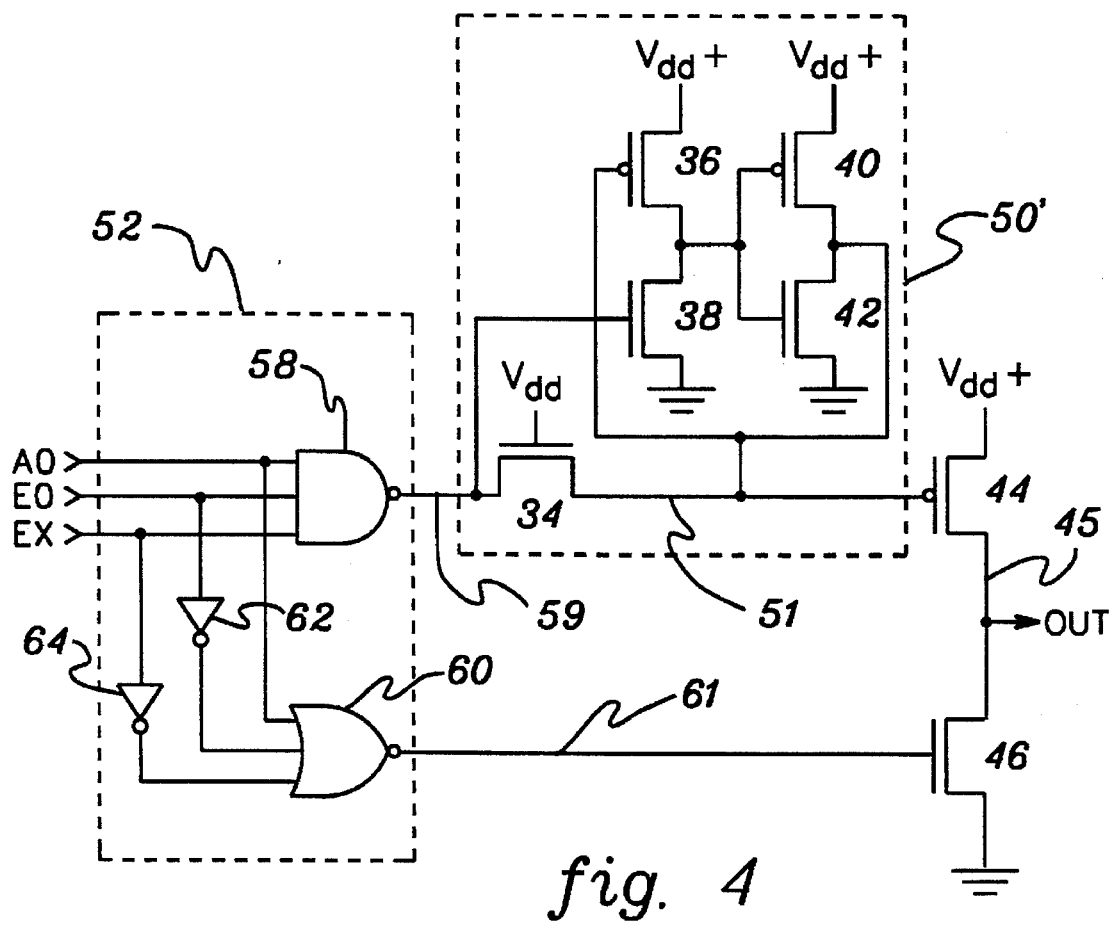
FIG. 4 is a simplified schematic diagram of the level shifting circuit of FIG. 3.
Figure 3:
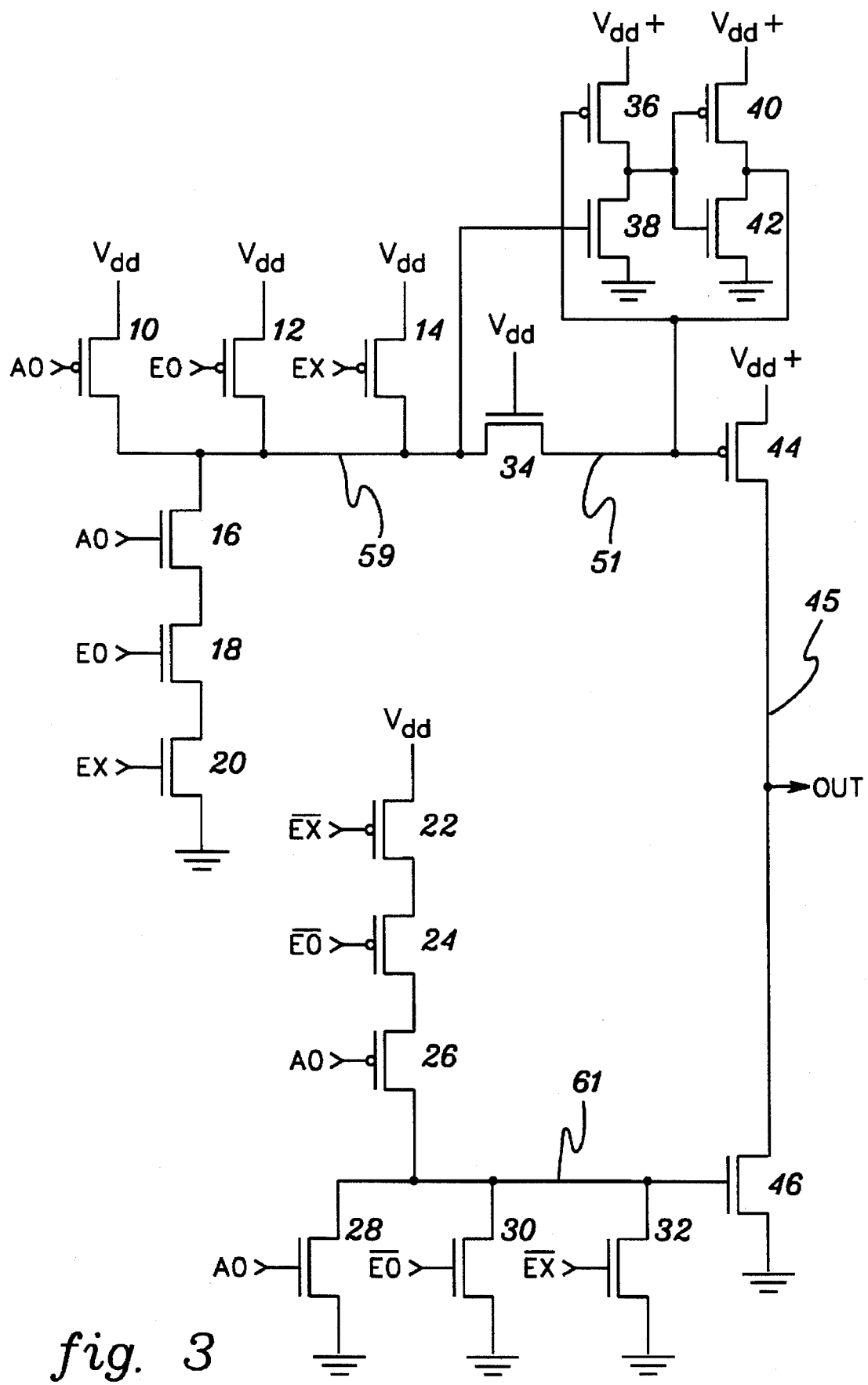
FIG. 3 is a schematic diagram of an alternative level shifting circuit in accordance with the present invention.

FIGS. 3 and 4 depict a level shift circuit similar to the first embodiment as described hereinbefore with reference to FIGS. 1 and 2, except that level shifter 50 has been modified wherein a signal from NAND gate 58 is fed forward to provide a more rapid response. The gate of N-FET 38 is coupled to the output of NAND gate 58, the input side of pass gate 34, while the gate of P-FET 36 is coupled to the output side of pass gate 34. For the level shift circuit of the first embodiment, NAND gate 58 sunk/sourced a current greater than the sourced/sunk current of inverter 56 in order to change the voltage level at node 51 and change the state of the latch network thereof. However, with this second embodiment of the level shift circuit 50', the transition speed of the latch network is increased by the feed forward technique.

Assume the output of NAND gate 58 transitions from a low state to a high state (at node 59). The gate of N-FET 38 receives this output and accordingly N-FET 38 begins to turn ON. Initially, N-FET 38 is not biased fully ON due to the opposition current sunk by N-FET 42. Because of the channel resistance of N-FET 34, there is a slight voltage drop across N-FET 34 such that N-FET 38 begins to turn ON. Accordingly, the voltage between the drains of P-FET 36 and N-FET 38 begins to transition low to partially enable P-FET 40. Therefore, the resulting output opposition current, as originally sank by N-FET 42, is not as great and the voltage at node 51 increases at a more rapid rate than in the first embodiment. As the voltage at node 51 increases, so too does the gate voltage of P-FET 36. Eventually, P-FET 36 is turned OFF and the signal output between the drains of P-FET 36 and 38 fully transitions low for turning N-FET 42 fully OFF and fully enabling P-FET 40. This causes node 51 to be brought up to the upper supply voltage $V_{dd+}$, via the channel of P-FET 40.

Again, as mentioned hereinbefore, pass gate 34 prevents the upper supply voltage $V_{dd+}$ from feeding back to the output of NAND gate 58. The gate of N-FET 34 is coupled to $V_{dd}$, the lower supply voltage. The source of N-FET 34 receives $V_{dd}$ from NAND gate 58. With a 0V gate-to-source voltage drop, N-FET 34 is disabled, providing isolation between its drain and source.

$V_{dd}$ provided from the output of NAND gate 58 is sufficient for fully enabling N-FET 38 so as to couple the gate of P-FET 40 to ground. With its gate tied to ground, P-FET 40 is fully enabled for coupling node 51 to the upper supply voltage $V_{dd+}$. Thus, with node 51 charged to $+V_{dd+}$, P-FET 44 of the complimentary output stage is disabled. N-FET 46, on the other hand, is fully enabled by the high logic level $V_{dd}$ supplied from the pull-down output 61 (NOR gate 60) of predriver 52.

The alternative logic transition, wherein the output of NAND gate 58 transitions from a high state to a low state, causes similar functionality as described hereinbefore with reference to the first embodiment. However, the negative going transition moves through level shifter 50' more rapidly for discharging node 51 and enabling P-FET 44. The low level output from NAND gate 58 is fed forward to the gate of N-FET 38 to begin turning N-FET 38 OFF. The low level output provides a gate-to-source voltage drop for N-FET 34 which is enabled. P-FET 40 initially is sourcing an opposition current to node 51 less than the current sinking capability of NAND gate 58, so that the voltage level at node 51 gradually decreases. The gate of P-FET 36 receives the decreasing voltage of node 51 and is gradually turned ON. With the gate of N-FET 38 tied directly to the output of NAND gate 58, it is disabled earlier during the transition than in the first embodiment so that the gates of P-FET 40 and N-FET 42 are more rapidly charged to $V_{dd+}$. Once N-FET 42 is fully enabled, node 51 is pulled to ground and P-FET 44 of the complimentary output stage is fully enabled. N-FET 46 is disabled via a low voltage level as provided by NOR gate 60. Thus, this alternative second embodiment provides a level shifter that is more responsive for discharging and charging node 51 than the level shifting circuit of the first embodiment.

Figure 5:
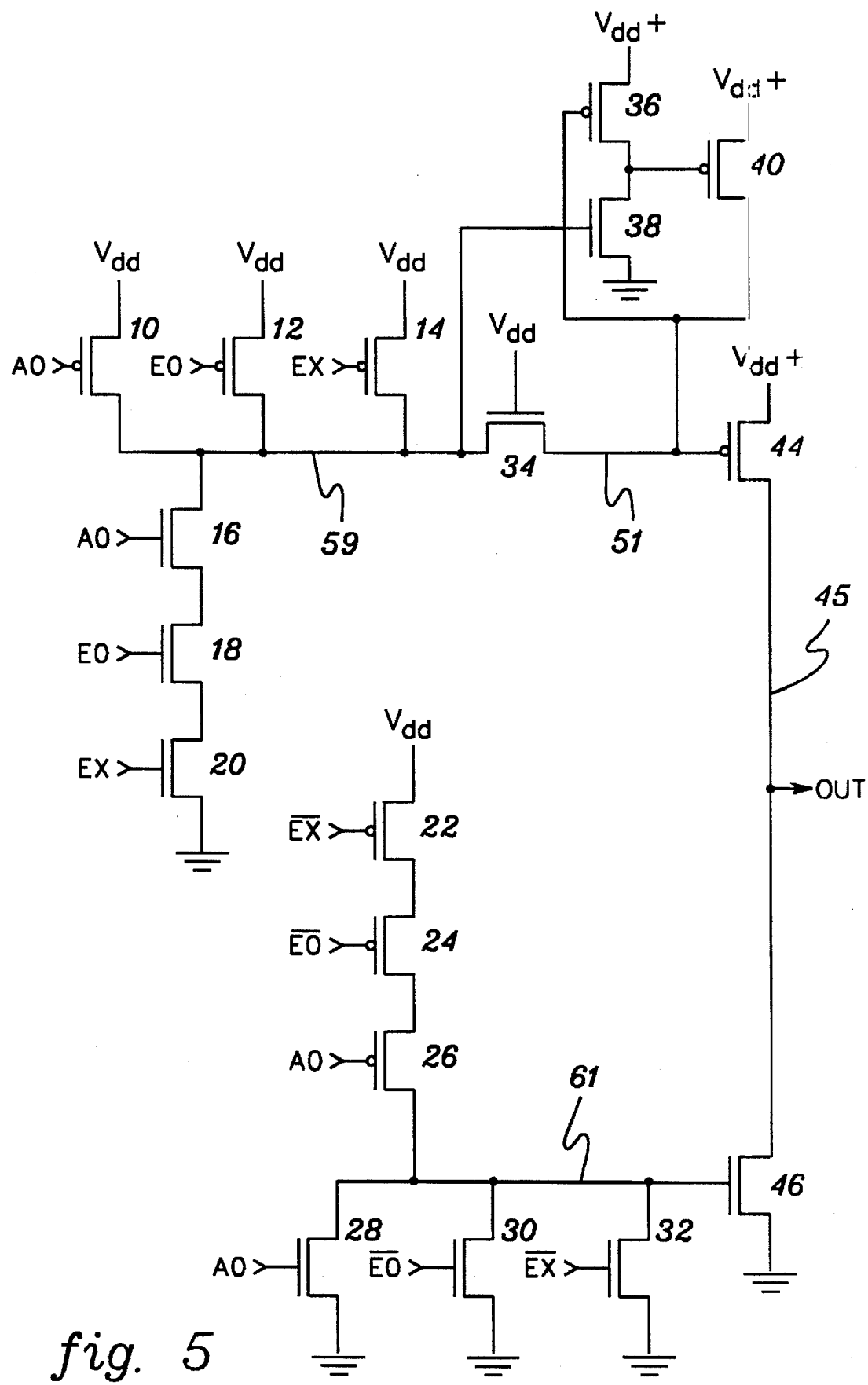
FIG. 5 is a schematic diagram of yet another level shifting circuit in accordance with the present invention.
Figure 6:
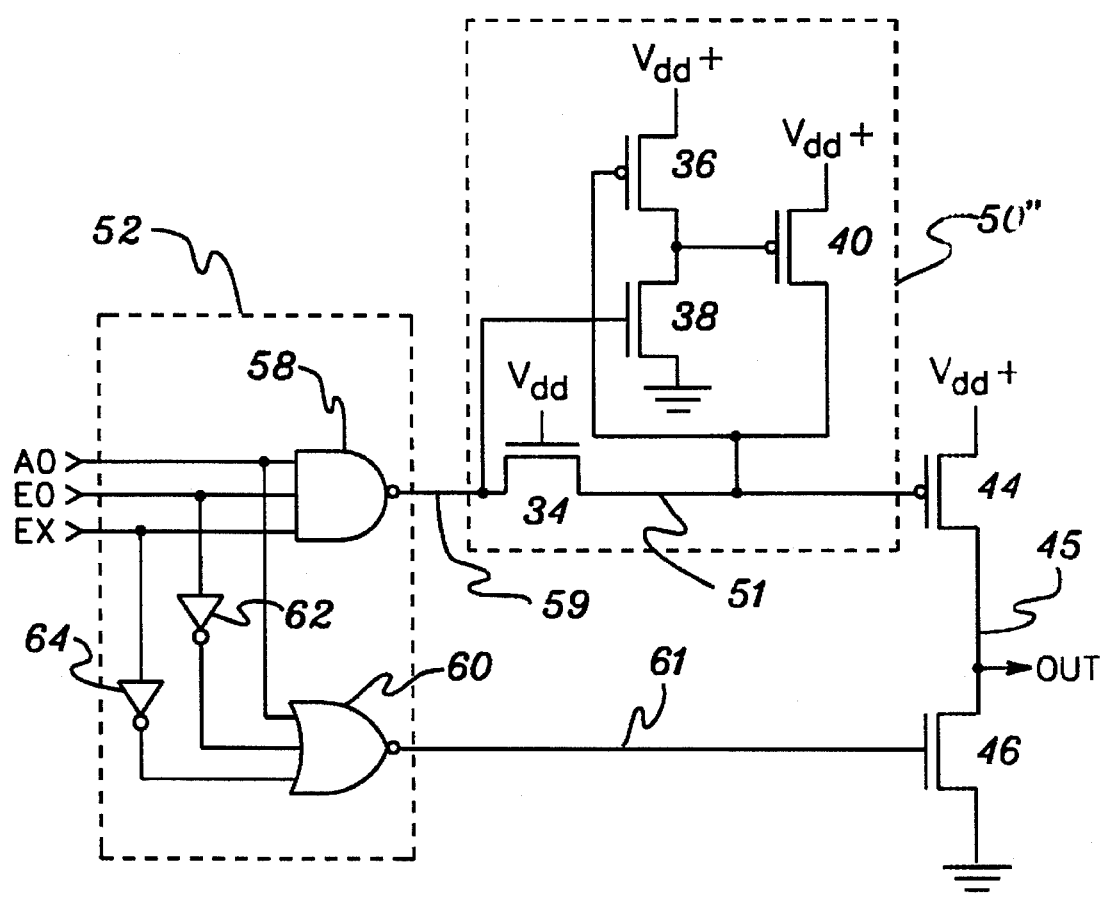
FIG. 6 is a simplified schematic diagram of the level shifting circuit of FIG. 5.

A level shifting circuit of a third embodiment of the present invention, with reference to FIGS. 5 and 6, corresponds to the level shifter of the second embodiment as described hereinbefore with the exception that the latching network has been simplified. Namely, latching network 50" corresponds to latching network 50' with the exception that N-FET 42 of inverter 56 has been removed. It can be shown that N-FET 42 of the latching network 50' is not necessary for proper level shifting operation.

Assuming a high output transition from NAND gate 58, wherein node 59 transitions from a low state to a high state, the gate of N-FET 38 receives the high voltage transition such that N-FET 38 is enabled. Accordingly, the output signal between the drains of P-FETs 36 and 38 begins transitioning low for gradually enabling P-FET transistor 40 to charge up node 51. In this third embodiment, there is no opposition current being sunk by what was originally N-FET 42 of the second embodiment; accordingly, node 51 charges up more rapidly to the upper supply voltage $V_{dd+}$. AS P-FET 40 is enabled, the voltage at node 51 increases for turning off P-FET 36. With P-FET 36 turned OFF and N-FET 38 ON, the gate of P-FET 40 is pulled to ground so that P-FET 40 is fully enabled, coupling $V_{dd+}$ to node 51. With node 51 coupled to $V_{dd+}$, P-FET 44 of the complimentary output stage is turned OFF. Again, N-FET 34 isolates the upper supply voltage $V_{dd+}$ (at its drain) from the low supply voltage $V_{dd}$ (at its source).

Alternatively, assuming the output of NAND gate 58 transitions from a high state to a low state, the low transition reaches the gate of N-FET 38 for turning off N-FET 38. Node 51 is gradually discharged as NAND gate 58 sinks a current greater than that sourced by P-FET 40. Eventually, the gate of P-FET 36 (tied to node 51) reaches a level for turning ON P-FET 36. With P-FET 36 ON and N-FET 38 OFF, the output signal between the drains of P-FETs 36 and 38 transitions high for disabling P-FET 40. Once P-FET 40 is fully disabled, node 51 is pulled to ground by NAND gate 58 via pass gate 34. With node 51 pulled to ground, P-FET 44 of the complimentary output stage is fully enabled for coupling output 45 to $V_{dd+}$. Accordingly, it is seen that there is no need for the additional N-FET 42 as was present in the prior embodiments.

In the present embodiment, the charge and discharge rates of node 51 differ. When node 51 is being charged, there is no opposition current. On the other hand, when node 51 is being discharged, NAND gate 51 is sinking a current greater than an opposition current sourced by P-FET 40. Preferably, the currents available for charging/discharging node 51 are set for effecting equivalent transitions.

Figure 7:
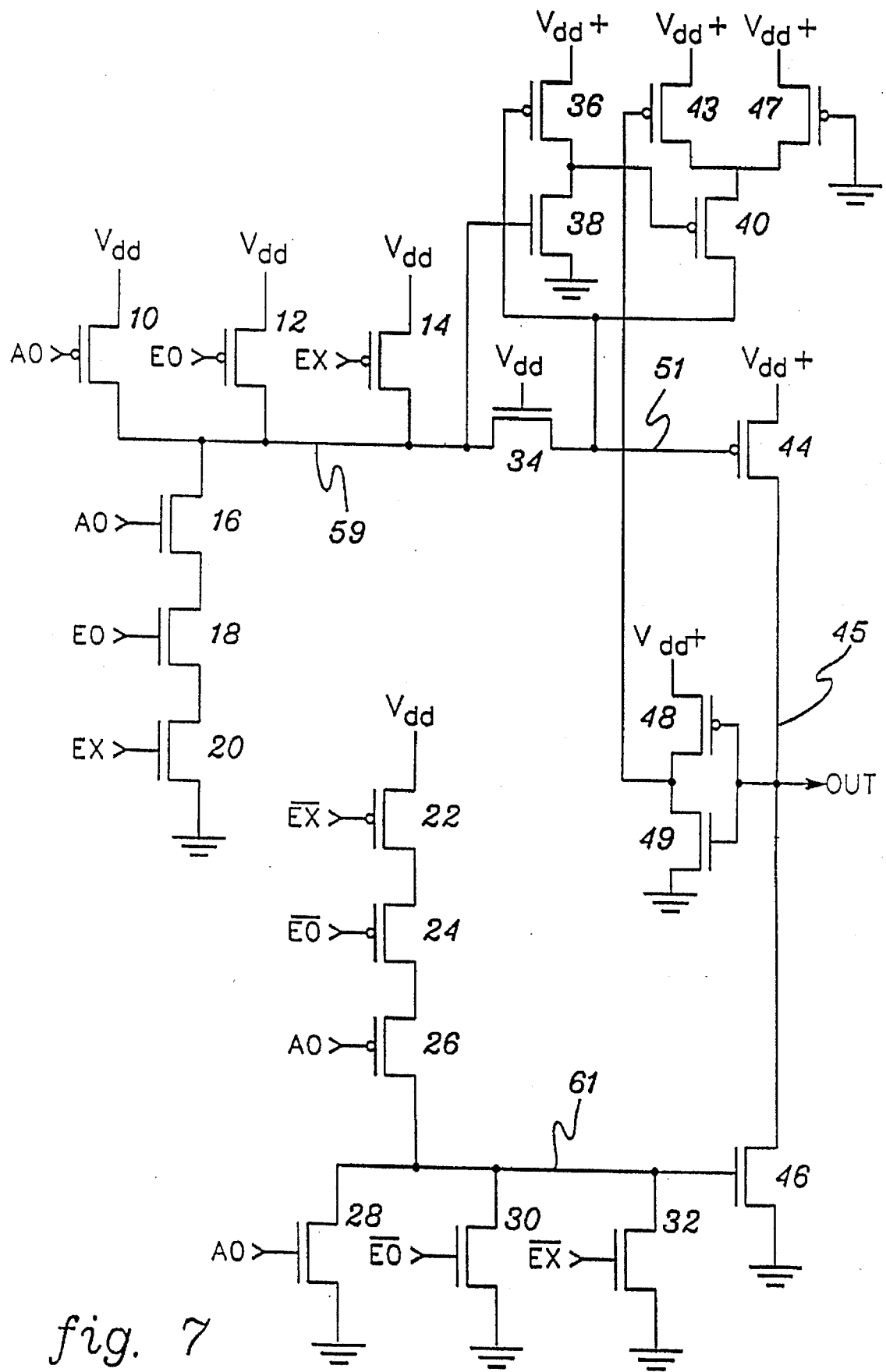
FIG. 7 is a schematic diagram of another level shifting circuit in accordance with the present invention including circuitry for improved responsiveness.

In a fourth embodiment of the present invention, with reference to FIG. 7, a gated variable resistance means is provided via the latching network for affecting the charge and discharge rates of node 51. The variable resistance means is gated by the signal present between the drains of P-FET 36 and N-FET 38. The resistance values are established in accordance with the parallel resistance of P-FET 43 and P-FET 47. When the output signal at output 45 is high, the inverter of P-FET 48 and N-FET 49 provide zero volts to the gate of P-FET 43 so that P-FET 43 is enabled ON. When P-FET 43 is enabled ON, it provides a parallel resistance with P-FET 47, which parallel resistance is in series with the resistance of P-FET 40 for driving node 51.

When output 45 is low, the inverter of FETs 48,49 supply a high level ($V_{dd+}$) to the gate of P-FET 43 so that it is disabled. When P-FET 43 is disabled, a greater resistance is provided between $V_{dd+}$ and node 51 equal to the series combination of P-FET 47 and P-FET 40.

Assuming the input signal A0 transitions low, the voltage at node 59 (provided by NAND gate 58) transitions from zero volts to the low supply voltage $V_{dd}$. N-FET 38 transitions ON, dropping the voltage between the drains of P-FET 36 and N-FET 38 for enabling P-FET 40. Accordingly, P-FET 40 charges node 51 with a current established in accordance with the parallel resistance value of P-FET 43 and P-FET 47. Note that the output voltage at output 45 is high during the transition such that P-FET 43 is enabled via the zero volts provided by the inverter of P-FET 48 and N-FET 49. Thus, the variable resistance means provides its low resistance value for charging up node 51 as quickly as possible. Once node 51 charges up to $V_{dd+}$, P-FET 44 is disabled and output 45 transitions from $V_{dd+}$ to zero volts via N-FET 46. With the output 45 at zero volts, the inverter of P-FET 48 and N-FET 49 provides a high level ($V_{dd+}$) to the gate of P-FET 43 for turning off P-FET 43. Thus, in a subsequent transition of input signal A0 (of an opposite polarity), there will be a low opposition current from the latching network supplied to node 51.

Assuming the input signal A0 transitions from low to high ($V_{dd}$), the output of NAND gate 58, at node 59, transitions low by sinking more current than that supplied by the variable resistance means. During the transition, output 45 is low and the inverter of P-FET 48 and N-FET 49 supplies a high level to the gate of P-FET 43 so that P-FET 43 is disabled. Therefore, the variable resistance means provides a high resistance value, per the parallel combination of P-FETs 43 and 47, for limiting the amount of opposition current supplied to node 51. Therefore, NAND gate 58 can quickly discharge node 51. As node 51 is discharged, P-FET 36 is enabled and N-FET 38 disabled. The signal between the drains of P-FET 36 and N-FET 38 transitions high $V_{dd+}$ for disabling P-FET 40 so that node 51 can be completely discharged to zero volts. P-FET 44 is then fully enabled (and P-FET 46 disabled) for bringing up the voltage at output 45. When the voltage at output 45 transitions high, the inverter of P-FET 48 and N-FET 49 supplies zero volts to the gate of P-FET 43. Being fully enabled, P-FET 43 provides a low parallel resistance in combination with P-FET 47 that enables a greater current to charge node 51 on the next transition of input signal A0.

Thus, the gated variable resistance means enables rapid charge and discharge of node 51. When node 51 has to be charged, the gated variable resistance means is of low resistance so that a greater current is available for charging up node 51 during the signal transition. On the other hand, when node 51 has to be discharged, the gated variable resistance means provides its maximum resistance value such that the opposing current (that has to be sunk by NAND gate 58) is kept to a minimum level during the signal transition.

Figure 8A:
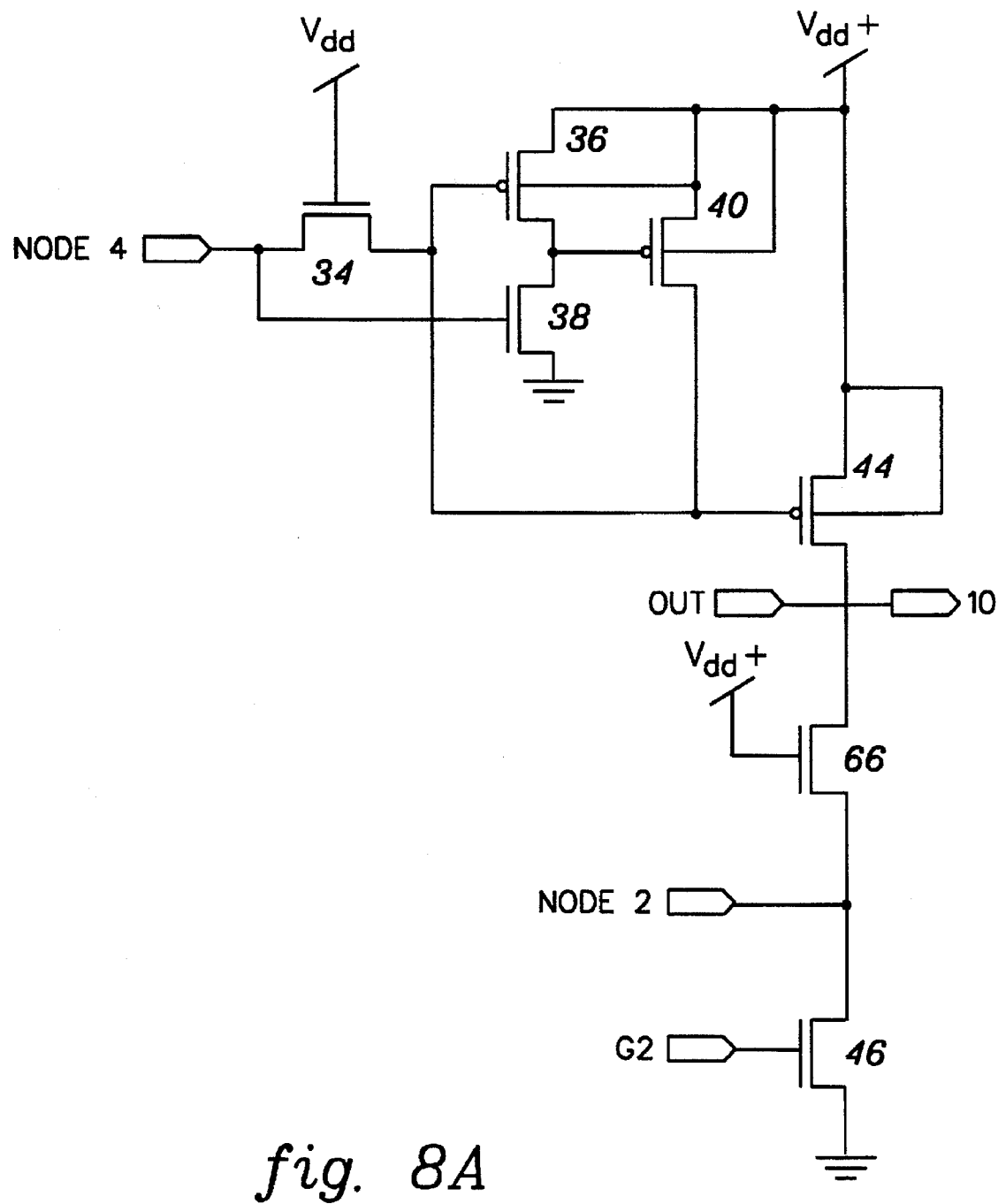
FIG. 8a is a partial schematic diagram of yet another embodiment of a level shifting circuit in accordance with the present invention.
Figure 8B:
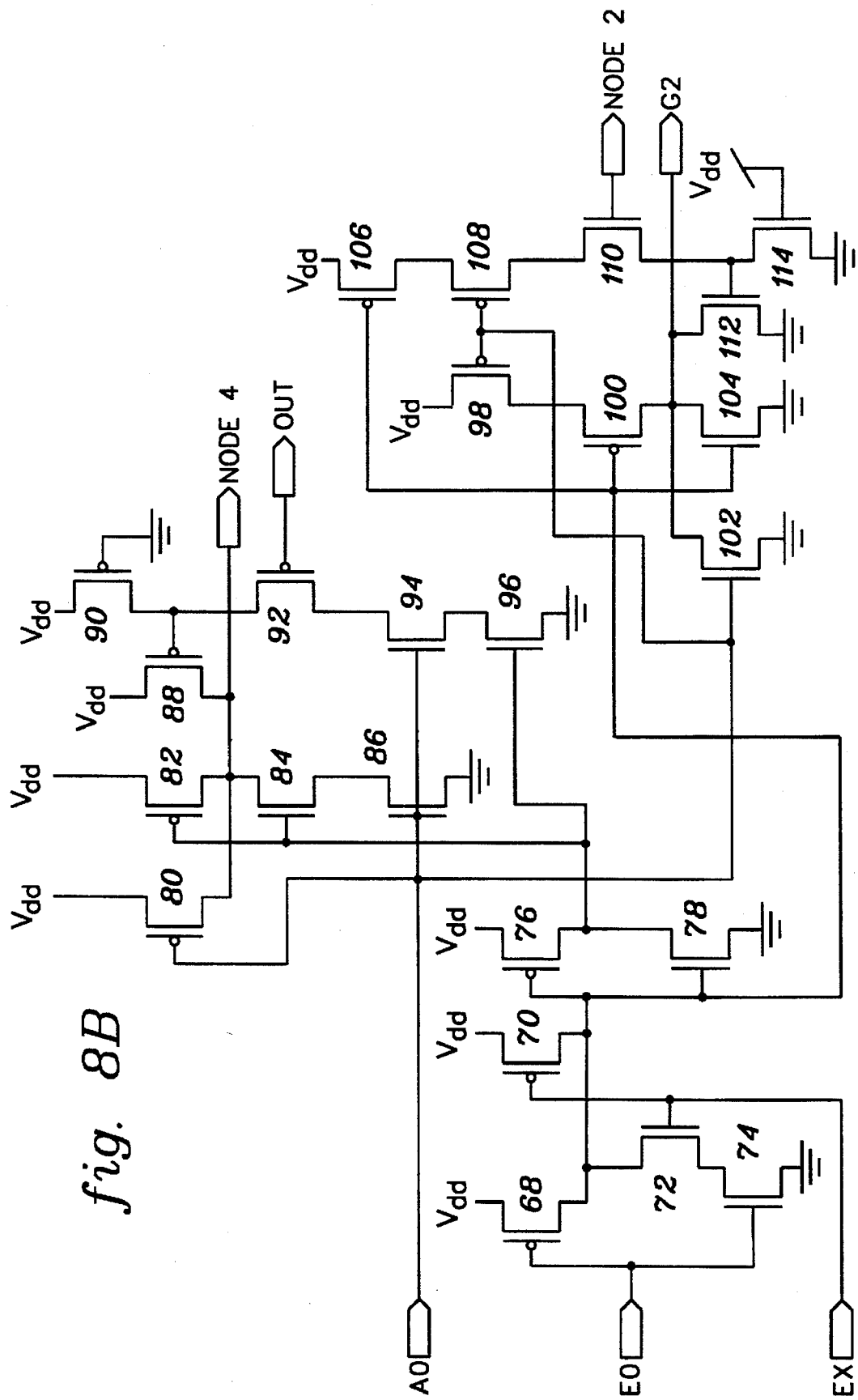
Figure 9:
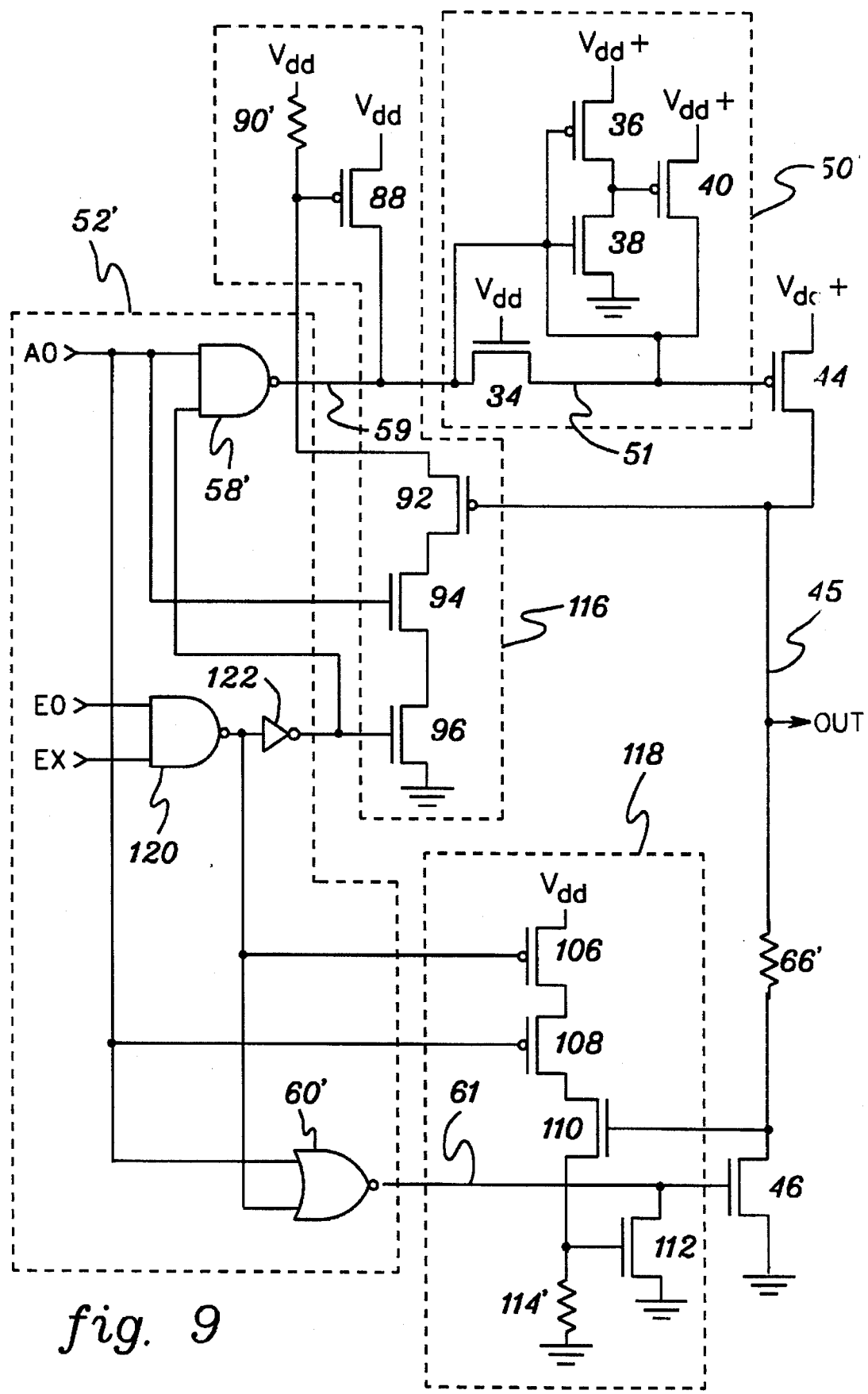
FIG. 9 is a simplified schematic diagram illustrating the level shifting circuit of FIGS. 8a and 8b.

FIGS. 8a, 8b and 9, portray a fifth embodiment of the present invention, wherein a level shifting circuit incorporates di/dt current controllers for controlling the speed at which the gates of complimentary output transistors 44 and 46 are charged or discharged. Assuming a steady state condition of zero volts at output 45, P-FET 92 is enabled. Assuming input signal A0 transitions from low to high ($V_{dd}$) for enabling N-FET 94, and that enable signals E0 and EX are both high for enabling N-FET 96, then a first totem pole, of P-FET 92, N-FET 94 and N-FET 96, is enabled ON for drawing a current through resistor 90' formed by P-FET 90. The voltage drop across resistor 90' provides a gate-to-source voltage drop for enabling P-FET 88. P-FET 88 therefore supplies a finite current, proportional to the voltage drop across resistor 90', to node 59 in opposition to the current sunk by NAND gate 58' during the transition of input signal A0.

In addition, P-FET 40 of level shift circuit 50" is also providing an opposition current to node 59 (via pass gate 34) during the transition of input signal A0. Therefore, NAND gate 58' must sink a current greater than the amount provided by P-FET 88 and P-FET 40 in order to discharge node 51 for enabling the output pull-up transistor P-FET 44. As NAND gate 58' sinks current, the voltage at node 51 gradually decreases. Eventually, P-FET 36 is enabled and N-FET 38 disabled so that the signal at the drains therebetween transitions high for disabling P-FET 40. Once P-FET 40 is disabled, the only opposition current provided is that of P-FET 88. Next, the voltage at node 51 drops to where P-FET 44 is enabled and the voltage at output 45 transitions high. When this occurs, P-FET 92 of the di/dt controller 116 is disabled, and the voltage presented to the gate of P-FET 88 transitions high $V_{dd}$ for disabling P-FET 88. Note that the lower pull-down di/dt controller 118 has P-FET 108 which was disabled when the input signal A0 transitioned from low to high ($V_{dd}$). Therefore the signal at node 61 transitioned quite rapidly from high to low for disabling N-FET 46.

Assuming an opposite transition of input signal A0 from high to low, pull-down di/dt controller 118 functions similarly, in a complimentary manner, to pull-up di/dt controller 116 of the previous example, for limiting the speed at which node 61 is charged. With output 45 high, N-FET 110 is enabled. When input signal A0 transitions from high to low, P-FET 108 is enabled. P-FET 106 is enabled given that E0 and EX are both high, i.e. NAND gate 120 pulls down the gate voltage presented to P-FET 106. Therefore, a second totem pole, of P-FET 106, P-FET 108, and N-FET 110, provides a serial path for passing current through resistor 114' comprising N-FET 114. The voltage drop across resistor 114' provides a gate-to-source voltage drop for enabling N-FET 112 to sink an opposition current from node 61 as NOR gate 60' supplies current to node 61. The di/dt controller 118 limits the current available for charging up node 61. Because the current supplied by NOR gate 60' is greater than the current sunk by N-FET 112, node 61 charges up for enabling N-FET 46. It can be shown that node 51 of the upper signal path is charged rapidly as NAND gate 58' supplies current to node 51 with no opposition current. Therefore, P-FET 44 is disabled quite rapidly relative to the charge rate of node 61.

Predriver 52' can be simply characterized with reference to particular FET groupings of FIG. 8b NAND gate 120, comprising FETs 68–74, receives two enable input signals, enable signal E0 and enable signal EX. The gates of P-FET 68 and N-FET 74 are tied to enable signal E0 while the gates of P-FET 70 and N-FET 72 are tied to enable signal EX. The output of NAND gate 120 is coupled to inverter 122, i.e. P-FET 76 and N-FET 78. NAND gate 58' receives at one input the combined enable signals inverted by inverter 122, and receives at the other input the data input signal A0. NAND gate 58' comprises FETs 80–86 which are arranged in appropriate NAND gate topology as known in the art. The output of NAND gate 58' provides the pull-up output 59 of predriver 52' which is coupled to the drain of P-FET 88 and the source of N-FET 34.

NOR gate 60', comprising FETs 98–102, receives at one input the combined enable signal from NAND gate 120, and receives at a second input data signal A0. The output of NOR gate 60' provides the pull-down output 61 of predriver 52' which is coupled to the drain of N-FET 112 and the gate of N-FET 46.

Ideally, the offset currents provided by di/dt controllers 116 and 118 taken together with level shift circuit 50" are ratio'd with respect to one another for providing a balanced output signal (at output 45) having equal slew rates between positive and negative transitions. The amount of opposition current supplied by di/dt controller 116 in combination with level shift circuit 50" corresponds to the opposition current supplied by di/dt controller 118 relative the respective sink/source currents of NAND gate 58' and NOR gate 60'. Note that level shift circuit 50" supplies opposition current via P-FET 40 from upper supply voltage $V_{dd+}$. The di/dt controller 116 supplies opposition current via P-FET 88 from the lower supply voltage $V_{dd}$. The opposition currents from the respective circuits are dependent upon the associated supply voltages. So while the amounts of opposition current may be correct for providing a balanced output signal when the supply voltages are at their specified levels, when the supply voltages deviate from their nominal levels, the opposition currents change. Thus, absent nominal supply voltages, the combined opposition current from di/dt controller 116 and level shift circuit 50" may not correspond to the opposition current of di/dt controller 118 and the output signal will no longer be balanced at output 45.

Accordingly, assuming nominal supply voltages, the level shift circuit of this fifth embodiment provides a balanced output signal of equal slew rate transitions while shifting the logic level of input signal A0 from a low voltage environment ($V_{dd}$) to a higher voltage environment ($V_{dd+}$). Note that di/dt controllers 116,118 and predriver 52 are biased by the low supply voltage $V_{dd}$, whereas the level shifter 50" provides opposition current from the high supply voltage $V_{dd+}$. With such an arrangement, it is necessary for the supply voltages to remain fixed within given tolerances in order to preserve the balance of the output signal.

Figure 10:
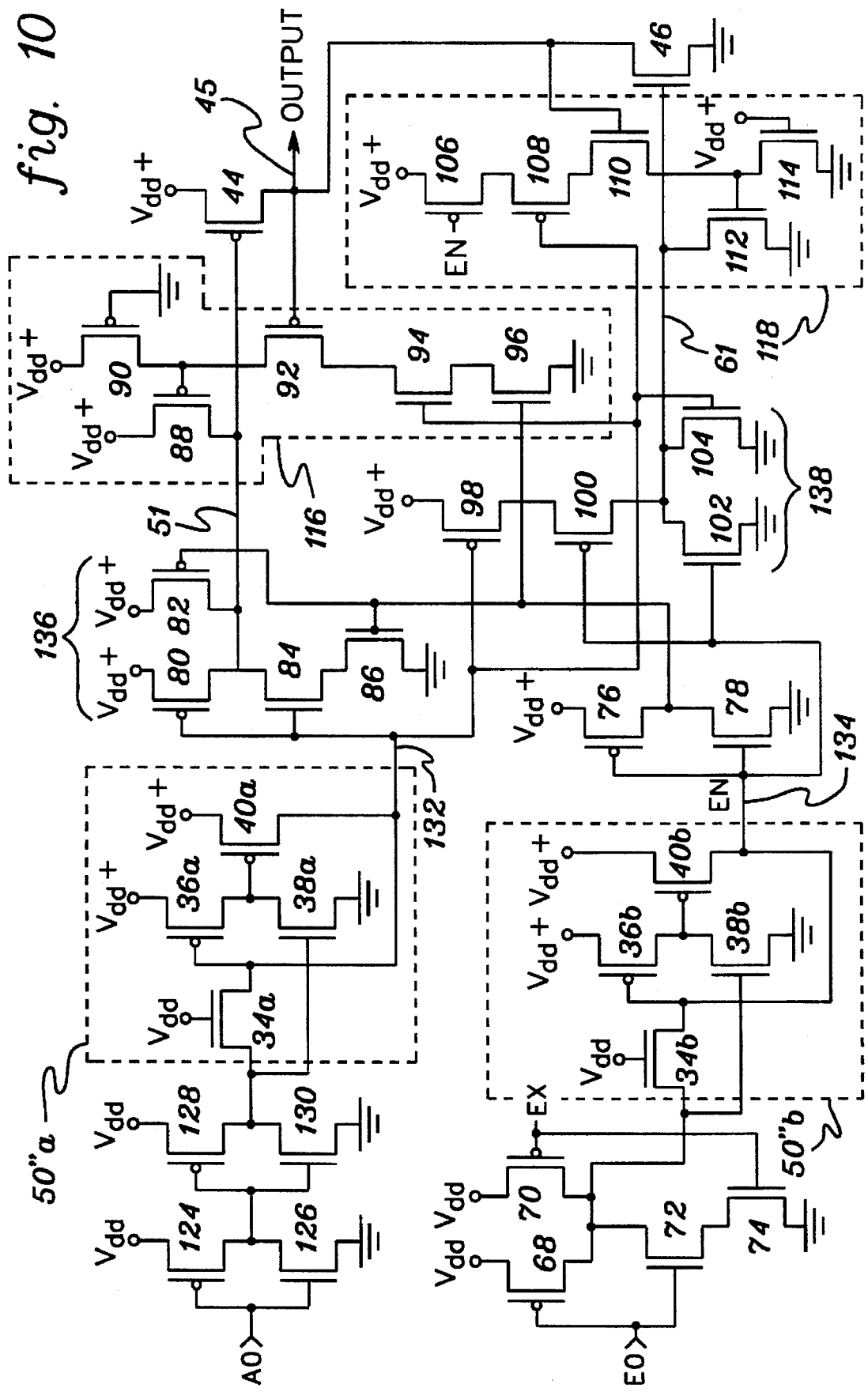
FIG. 10 is a schematic diagram of another alternative embodiment of a level shifting circuit in accordance with the present invention.

To simplify balancing of the positive/negative transitions of the output signal, an alternative sixth embodiment of the present invention, with reference to FIG. 10, moves the level shift 50" further ahead in the respective pull-up and pull-down signal paths of the predriver circuit. By moving the level shift circuitry forward, the level shifting circuit is separated from the di/dt controller so as to simplify the balancing design in terms of providing opposition current to node 51.

Data input signal A0 is presented to a first inverter followed by a second inverter, FET devices 124–130. The buffered data input signal is then coupled to pass gate 34A of level shift circuit 50"A comprising FET devices 34A–40A, of the same topology as the level shift circuit 50" of the previous embodiment. Level shift circuit 50"A shifts the logic level of the buffered data input signal from low logic levels as associated with low supply voltage $V_{dd}$ to higher logic levels as associated with high supply voltage $V_{dd+}$. The level shifted data input signal is made available at node 132.

In a lower path, enable signals E0 and EX are presented to respective inputs of a NAND gate comprising FET devices 68–74 (which are biased by lower supply voltage $V_{dd}$). The logic output of this NAND gate is coupled to the input of level shifting circuit 50"B, comprising FET devices 34B–40B. The combined level shifted enable signal is presented at the output node 134 of level shift circuit 50'B.

The level shifted data input signal at node 132 is tied to one input of a NAND gate 136 (comprising FETs 80–86) in the pull-up signal path, while the other input of NAND gate 136 is coupled to the combined level shifted enable signal, via an inverter of P-FET 76 and N-FET 78. It is noted that the NAND gate 136 is biased to the upper supply voltage $V_{dd+}$. In the lower pull-down signal path, the level shifted data input signal at node 132 is coupled to a first input of NOR gate 138 (comprising FET devices 98–104), NOR gate 138 also is biased by the upper supply voltage $V_{dd+}$. The second input of NOR gate 138 is coupled to the combined level-shifted enable signal at node 134.

Thus far, what has been described is a predriver incorporating level shifting for respective pull-up and pull down signal paths for driving a complimentary output stage. Note that the signals presented from NAND gate 136 and NOR gate 138 are logic signals associated with the upper supply voltage $V_{dd+}$. The output of NAND gate 136 drives node 51, the gate of P-FET 44. The output of NOR gate 138 drives node 61, the gate of N-FET 46. Pull-up di/dt controller 116 is coupled to node 51 of the pull-up signal path, whereas pull-down di/dt controller 118 is coupled to node 61 of the pull-down signal path.

Pull-up di/dt controller 116 comprises FETs 88–96. P-FET 88 has its source tied to upper supply voltage $V_{dd+}$, its drain coupled to node 51, and its gate tied to the drain of P-FET 90. The source of P-FET 90 is coupled to the upper supply voltage $V_{dd+}$ and its gate is grounded. P-FET 90 accordingly provides a resistance coupled in a serial totem pole arrangement with P-FET 92, N-FET 94 and N-FET 96. The source of P-FET 92 is coupled to the drain of P-FET 90. The gate of P-FET 92 is coupled to the output node 45, while the drain of P-FET 92 is coupled to the drain of N-FET 94. The gate of N-FET 94 is coupled to node 132 to receive the level shifted data input signal. The source of N-FET 94 is coupled to the drain of N-FET 96. The gate of N-FET 96 is coupled to receive the inverted level shifted enable signal from the drains of P-FET 72 and N-FET 78. The source of N-FET 96 is grounded.

When node 51 transitions from high to low, the output signal at output 45 is initially low for enabling P-FET 92. The level shifted data input at node 132 is high for enabling N-FET 94, and it is assumed that the inverted level shifted enable signal is high for enabling N-FET 96. In this condition, the totem pole arrangement of FETs 92–96 send a bias current through P-FET 90 that provides a gate-to-source voltage drop $V_{gs}$, for enabling P-FET 88. P-FET 88 provides an opposition current, proportionate to $V_{gs}$, to node 51. When NAND gate 136 is suppose to discharge node 51, it must sink a current greater than the opposition current provided by P-FET 88 in order to drop the voltage at node 51 for enabling P-FET 44. Note that NAND gate 136 and pull-up di/dt controller 116 are both biased to the upper supply voltage $V_{dd+}$. Accordingly, the transistor geometries may be easily ratio'd for providing a desired discharge rate for discharging node 51 without having to worry about supply voltage differences. Namely, the channel geometries of N-FET 84 and N-FET 86 can be made to sink a current greater than that being sourced by P-FET 88 (per its $V_{gs}$ drop). Once node 51 discharges to zero volts, P-FET 44 is enabled and the output signal at output 45 transitions from low to high $V_{dd+}$, which disables P-FET 92 of pull-up di/dt controller 116. In this fashion, pull-up di/dt controller 116 controls the timing of a positive transition at output 45. Note that there is no requirement to account for an additional opposition current of a level shift circuit as was required in the previous embodiment (with reference to FIG. 9). Thus, the design of di/dt current controller 116 is simplified.

Pull-down di/dt controller 118 is a complimentary representation of pull-up di/dt controller 116. N-FET 112 has its drain coupled to node 61, its source coupled to ground, and its gate coupled to the drain of N-FET 114. The source of N-FET 114 is grounded while its gate is tied to the upper supply voltage, $V_{dd+}$. The drain of N-FET 114 is tied to the source of N-FET 110 which has its gate coupled to output 45. The drain of N-FET 110 is coupled to the drain of P-FET 108. The gate of P-FET 108 is coupled to node 132 for receiving the level shifted data input signal. The source of P-FET 108 is tied to the drain of P-FET 106. The gate of P-FET 106 is coupled node 134 to receive the level shifted enable signal. The source of P-FET 106 is tied to the upper supply voltage $V_{dd+}$.

Pull-down di/dt controller 118 operates in a manner similar to the pull-up di/dt controller 116 except that the circuit is operative for controlling a negative transition at output 45 instead of a positive transition. N-FET 112 sinks an opposition current when the output signal at output 45 is high and input signal A0 has transitioned low for enabling the current path through N-FET 114 and the totem pole arrangement of FETs 106–110. The current passing through N-FET 114 provides a gate-to-source voltage drop $V_{gs}$, for enabling N-FET 112 to sink a current in accordance with $V_{gs}$. NOR gate 138 sources a current greater than the opposition current of N-FET 112 in order to charge node 61. As node 61 charges up for enabling N-FET 46, the output signal at output 45 drops from high to low, which disables N-FET 110. The rate at which the output signal transitions low is dependent upon the speed at which node 61 is charged. Pull-down di/dt controller 118 and NOR gate 138 are both biased to the upper supply voltage $V_{dd+}$; therefore, di/dt controller 118 and NOR gate 138 can be designed very easily to provide a given charge rate for node 61. There is no problem of differing supply voltages between current sinking devices and current sourcing devices.

In sum, the level shift circuits 50'A and 50'B are moved further up respective signal paths in order to be separated from and simplify the design of respective di/dt controllers 116,118. In addition, part of the predriver circuitry, i.e NAND gate 136 and NOR gate 138, and the associated pull-up di/dt controller 116 and pull-down di/dt controller 118 are biased by the same voltages for establishing proportionate sourcing/sinking current ratios for controlling the output slew rates. In this fashion, balanced positive/negative transitions are consistently provided.

What has been disclosed by the present invention are level shifting circuits for interfacing low voltage logic devices to higher voltage logic devices while protecting the low voltage logic devices from the greater voltages of the high voltage logic devices. In addition, what has been disclosed by the present invention are level shifting circuits of quick responsiveness and balanced operation.

While the invention has been particularly shown and described with reference to preferred embodiments thereof, it will be understood by those skilled in the art that various changes in form and details may be made therein without departing from the spirit and scope of the invention which the following claims are intended to encompass.

What is claimed is:

1. A level shifter comprising:

a first terminal for receiving an input signal of a first voltage magnitude;

a second terminal for sending out an output signal representative of said input signal, but of a second voltage magnitude;

a first supply node for providing a first supply voltage corresponding to said first voltage magnitude;

a second supply node for providing a second supply voltage corresponding to said second voltage magnitude;

a pass gate disposed between said first terminal and said second terminal;

a first P-MOSFET having its source coupled to said second supply node for receiving said second supply voltage, its gate coupled to said second terminal, and its drain coupled to an intermediate node;

a first N-MOSFET having its source coupled to ground, its gate directly coupled to said first terminal for receiving said input signal directly, and its drain coupled to said intermediate node; and a second P-MOSFET having its source coupled to said second supply node for receiving said second supply voltage, its gate coupled to said intermediate node, and its drain coupled to said second terminal.

2. A level shifter according to claim 1, wherein a channel on-resistance of said second P-MOSFET is high enough such that when said second P-MOSFET is fully ON, its current sourcing capability to said second terminal is less than a current capable of being sank by said input signal via said pass gate.

3. A level shifter according to claim 1, wherein said pass gate comprises a second N-MOSFET having its drain/source coupled to said first terminal, its source/drain coupled to said second terminal, and its gate coupled to said first supply node for receiving said first supply voltage.

4. A level shifter according to claim 1, wherein said second voltage magnitude is greater than said first voltage magnitude.

5. A level shifting driver, comprising:

a first terminal for providing a first supply voltage;

a second terminal for providing a second supply voltage that is greater than the first supply voltage;

an output terminal;

a pull-up device disposed between the output terminal and the second terminal and having a pull-up device gate coupled to a first node;

a level shifter circuit disposed between the second terminal and the first node;

a pull-up predrive circuit coupled to the first terminal and providing a predrive signal at a second node of a magnitude limited according to the first supply voltage;

a pass gate disposed between the second node and the first node;

a first P-MOSFET having its source coupled to the second terminal for receiving the second supply voltage, its gate coupled to the first node, and its drain coupled to an intermediate node;

a first N-MOSFET having its source coupled to ground, its gate coupled directly to the second node, and its drain coupled to said intermediate node; and a second P-MOSFET having its source coupled to the second terminal for receiving the second supply voltage, its gate coupled to said intermediate node, and its drain coupled to the first node.

6. A level shifting driver according to claim 5, wherein said second P-MOSFET has a current sourcing capability less than a current sinking capability of said pull-up predriver circuit.

7. A level shifting driver according to claim 5, wherein said pass gate comprises an N-MOSFET having its source/drain coupled to the second node, its drain/source coupled to the first node, and its gate coupled to the first terminal for receiving the first supply voltage.

8. A level shifting driver according to claim 7, wherein said pull-up device comprises a P-MOSFET having its source coupled to the second terminal for receiving the second supply voltage, its drain coupled to the output terminal, and its gate coupled to the first node.

9. A level shifting driver according to claim 5, wherein said pull-up predrive circuit comprises a NAND gate bias coupled to the first terminal for biasing by the first supply voltage, said NAND gate having first and second inputs for receiving a data input signal and an enable input signal respectively, said NAND gate logically combining the data input signal and the enable input signal per a NAND function to provide said predrive signal at an output thereof coupled to the second node.

* * * * *